(12) United States Patent
Chen et al.

(10) Patent No.: US 8,067,352 B2
(45) Date of Patent: Nov. 29, 2011

(54) AQUEOUS CLEANING COMPOSITION FOR SEMICONDUCTOR COPPER PROCESSING

(75) Inventors: Chien Ching Chen, Lu-Chuh Hsiang (TW); Wen Cheng Liu, Lu-Chuh Hsiang (TW); Tsung Hsien Chuang, Lu-Chuh Hsiang (TW); Jui Ching Chen, Lu-Chuh Hsiang (TW)

(73) Assignee: Epoch Material Co., Ltd., Kaoh Siung County (TW)

( * ) Notice: Subject to any disclaimer, the term of this patent is extended or adjusted under 35 U.S.C. 154(b) by 0 days.

(21) Appl. No.: 12/048,277

(22) Filed: Mar. 14, 2008

(65) Prior Publication Data

US 2009/0036343 A1   Feb. 5, 2009

(30) Foreign Application Priority Data

Aug. 3, 2007   (TW) .............................. 96128774 A

(51) Int. Cl.
*C23F 1/00* (2006.01)

(52) U.S. Cl. .................. 510/175; 510/405; 510/500

(58) Field of Classification Search ................ 510/175
See application file for complete search history.

(56) References Cited

U.S. PATENT DOCUMENTS

| | | | |
|---|---|---|---|
| 5,863,344 A | 1/1999 | Nam | |
| 5,988,186 A | 11/1999 | Ward et al. | |
| 6,139,763 A | 10/2000 | Ina et al. | |
| 6,492,308 B1 | 12/2002 | Naghshineh et al. | |
| 6,498,131 B1 | 12/2002 | Small et al. | |
| 6,546,939 B1 | 4/2003 | Small | |
| 6,716,803 B2 | 4/2004 | Kakizawa et al. | |
| 2004/0134873 A1* | 7/2004 | Yao et al. ........................ | 216/2 |
| 2006/0229221 A1 | 10/2006 | Walker et al. | |
| 2006/0293208 A1* | 12/2006 | Egbe et al. ................. | 510/407 |
| 2007/0066508 A1 | 3/2007 | Chen et al. | |

* cited by examiner

*Primary Examiner* — Harold Pyon
*Assistant Examiner* — Timothy Chiang
(74) *Attorney, Agent, or Firm* — Thomas E. Onholt; Steven D. Weseman

(57) ABSTRACT

The invention relates to an aqueous cleaning composition for use in a cleaning process during or after a chemical mechanical planarization for a copper integrated circuit processing, comprising 0.05 to 20 wt % of a nitrogen-containing heterocyclic organic base, 0.05 to 50 wt % of an alcohol amine, 0.01-10 wt % of a quaternary ammonium hydroxide, and water. When used during or after the planarization process, the inventive cleaning composition of the invention can effectively remove residual contaminants from the surfaces of the wafers and simultaneously maintain a good surface roughness of the wafers.

11 Claims, No Drawings

AQUEOUS CLEANING COMPOSITION FOR SEMICONDUCTOR COPPER PROCESSING

RELATED APPLICATIONS

This application claims priority to Republic of Taiwan Application No. 096128774, filed Aug. 3, 2007, and which is incorporated by reference in its entirety.

FIELD OF THE INVENTION

The invention relates to an aqueous cleaning composition used in chemical mechanical planarization (CMP) in copper integrated circuit processing.

BACKGROUND OF THE INVENTION

The trend of development in semiconductor elements nowadays is toward smaller line width and higher integrated density. When the minimum line width of an integrated circuit is reduced to below 0.25 μm, the time delay (RC delay) caused by the resistance of the metal wire itself and the spurious capacitance of the dielectric layer becomes a crucial influence on the operation rate of the elements. Therefore, in order to increase the operation rate of the elements, copper metal wires have been gradually adopted in high-level processing below 0.13 μm to replace the traditional aluminum-copper alloy wires.

The application of chemical mechanical planarization technology in the copper metal wire processing not only overcomes the problem of difficulty in defining patterns due to the difficulty of copper metal etching, but also forms a plane with global planarity upon polishing, so that the multi-layer wire processing can be easily carried out. The principle of chemical mechanical planarization is that wear is produced on the wafer surface by utilizing both polishing particles and chemical aids in a polishing slurry, whereby the higher part of the uneven surface has a high removal rate due to high pressure while the lower part of the uneven surface has a low removal rate due to low pressure, and thus the purpose of global planarity can be achieved.

Large quantities of fine polishing particles and chemical aids in the polishing slurry and the scraps peeled during the wafer polishing may attach to the wafer surface during the polishing step of the chemical mechanical planarization. In general, the common contaminants found on the chips after polishing are metal ions, organic compounds, polishing particles, and the like. If there is no effective cleaning procedure to remove the above-described contaminants, the subsequent processing will be affected, and the yield and the reliability of the elements will decrease. Therefore, the cleaning processing during or after the CMP polishing has become a crucial technology to determine whether CMP can be successfully applied in semiconductor processing.

In the polishing slurry used in copper processing, benzotriazole (BTA) and its derivatives are often employed as a corrosion inhibitor. In the contaminants generated by polishing wafers in the copper processing, the organic BTA residues are most difficult to remove, mainly because the BTA residues are bonded on the copper wires by chemical adsorption. Physical removal methods such as static repulsive force, ultrasonic vibration, scrubbing with a polyvinyl alcohol (PVA) brush etc., are traditionally used, but it is not easy to obtain a good cleaning effect.

Traditional inter-metal dielectric layers and W plugs that have been treated by chemical mechanical planarization are usually cleaned with ammonia solution and/or fluorine-containing compounds, but the above solutions are not suitable for the wafers for copper metal wires. The ammonia solution will unevenly corrode the surface of copper metal, resulting in coarsening. The fluorine-containing compounds will not only coarsen the copper surface but also cost more in terms of human safety protection and waste solution treatment in order to avoid doing harm to human health and to the environment.

Ina et al. disclose in U.S. Pat. No. 6,139,763 a polishing composition that can effectively remove tantalum metal from a substrate, which consists of polishing particles, an oxidant that can oxidize tantalum metal, a reducer that can reduce tantalum oxide (such as oxalic acid) and water. This polishing composition can further comprise piperazine (a nitrogen-containing heterocyclic organic base). According to Ina et al.'s teaching, the piperazine can be used on the surface of the copper layer during polishing to prevent the formation of surface impairment, such as recesses, dishing or erosion, which also can protect the polishing surface so as to produce a mirror-like surface. However, the use of the piperazine in an aqueous cleaning solution employed in the post chemical mechanical planarization in the copper processing is not taught or suggested by Ina et al.

Small discloses in U.S. Pat. No. 6,546,939 (Taiwan Patent No. 396202) a method of removing chemical residues from a surface of a metal or dielectric layer, wherein an aqueous composition with a pH between 3.5 and 7 is placed in contact with the metal or dielectric layer for a period of time sufficient to remove the chemical residues. This aqueous composition comprises an organic acid having mono-, bi- or trifunctional groups, a buffering amount of a base of quaternary amine, ammonium hydroxide, hydroxylamine, hydroxylamine salt or hydrazine salt, and a choline hydroxide.

Small et al. disclose in U.S. Pat. No. 6,498,131 a cleaning agent. The cleaning agent consists of a nonionic surfactant, amines, quaternary amines and a surface retention agent selected from ethylene glycol, propylene glycol, polyethylene oxide and mixtures thereof, and is used to clean the residues of the chemical mechanical planarization processing.

Naghshineh et al. disclose in U.S. Pat. No. 6,492,308 a cleaning agent. The cleaning agent consists of tetraalkylammonium hydroxide, polar organic amine and a corrosion inhibitor, and is used to clean a copper-containing integrated circuit.

Nam discloses in U.S. Pat. No. 5,863,344 a cleaning agent. The cleaning agent consists of tetramethylammonium hydroxide, acetic acid and water, and is used to clean semiconductor elements, wherein the volume ratio of acetic acid to tetramethylammonium hydroxide is preferably 1 to about 50.

Masahiko et al. disclose in U.S. Pat. No. 6,716,803 a method of cleaning a semiconductor substrate with copper wires on its surface. The cleaning agent used in this method comprises a surfactant and a nitrogen-containing alkaline substance.

Ward et al. disclose in U.S. Pat. No. 5,988,186 a cleaning agent. The cleaning agent consists of a water-soluble polar solvent, an organic amine and a benzene ring corrosion inhibitor, and is used to remove organic and inorganic substances.

Walker et al. disclose in U.S. Patent Publication No. 20060229221 (Taiwan Publication No. 200706647) a liquid cleaning agent providing a low metal etching rate. The cleaning agent consists of a quaternary ammonium hydroxide, an alkyl alcohol amine, and water, and is used for cleaning microelectronic substrates.

Chen et al. disclose in U.S. Patent Publication No. 20070066508 (Taiwan Publication No. 200641121) an aqueous cleaning composition for semiconductor copper. The cleaning composition comprises a nitrogen-containing heterocyclic organic base, an alcohol amine, and water, and is used for cleaning wafers having copper wires that have been treated by chemical mechanical planarization in integrated circuit processing.

With the development of semiconductor wafer processes, the width between the metal wires has been reduced to 32 nanometers. There remain many problems associated with the new planarization processes to be solved. For instance, the surface roughness of the wafer surfaces with nano line widths that have been processed may become poor, and the properties of copper wire wafers with a reduced line width, as measured by an open/short test and reliability test, may also become poor. For cleaning processes for wafers having copper circuits, there is a need for cleaning compositions that can more effectively remove the contaminants from the surfaces of the wafers and reduce the defects on the wafer surfaces than the prior art.

SUMMARY OF THE INVENTION

The invention provides an aqueous cleaning composition for use during or after the chemical mechanical planarization in copper processing, comprising a nitrogen-containing heterocyclic organic base, an alcohol amine, a quaternary ammonium hydroxide, and water. After contact with copper-containing semiconductor wafers for an effective period of time, the aqueous cleaning composition of the present invention can effectively remove the residual contaminants from the surfaces of the polished wafers, reduce the defects on the wafer surfaces, and simultaneously maintain a better surface roughness of the wafer surfaces.

DETAILED DESCRIPTION OF THE INVENTION

The aqueous cleaning composition of the invention comprises, on the basis of the total weight of the composition, 0.05 to 20 wt % of a nitrogen-containing heterocyclic organic base, 0.05 to 50 wt % of an alcohol amine, 0.01 to 10 wt % of a quaternary ammonium hydroxide, and water.

The alcohol amine compound used in the aqueous cleaning composition of the invention can evenly etch the surface of the copper layer without causing the surface roughness properties of the copper circuits poorer. As for the nitrogen-containing heterocyclic organic base, the lone electron pairs of the nitrogen atom on the heterocyclic ring will bond with the copper circuits, so as to avoid the re-adsorption of the organic contaminants that have left the copper circuits. The quaternary ammonium hydroxide may further enhance the cleaning capability of the cleaning composition on wafer surfaces.

The nitrogen-containing heterocyclic organic base used in the invention may be selected from the group consisting of piperazine, 2-(1-piperazine)ethanol, and 2-(1-piperazine)ethylamine, and a mixture thereof, among which piperazine is preferred. The amount of the nitrogen-containing heterocyclic organic base used in the invention ranges from 0.05 to 20 wt %, preferably from 0.1 to 15 wt %, and more preferably from 0.15 to 10 wt %, on the basis of the total weight of the composition.

The alcohol amine used in the invention may be selected from the group consisting of ethanolamine, diethanolamine, triethanolamine, propanolamine, methyl ethanolamine, and methyl diethanolamine, and a mixture thereof. Preferably, the alcohol amine is selected from the group consisting of ethanolamine, diethanolamine, and triethanolamine, and a mixture thereof. The amount of the alcohol amine used in the invention ranges from 0.05 to 50 wt %, preferably from 0.1 to 45 wt %, and more preferably from 0.15 to 40 wt %, on the basis of the total weight of the composition.

The quaternary ammonium hydroxide used in the present invention may be selected from tetraalkylammonium hydroxides, and preferably is selected from the group consisting of tetramethylammonium hydroxide, tetraethyl ammonium hydroxide, tetrapropylammonium hydroxide, and tetrabutylammonium hydroxide, and a mixture thereof. The amount of the quaternary ammonium hydroxide used in the invention ranges from 0.01 to 10 wt %, preferably from 0.02 to 10 wt %, and more preferably from 0.05 to 8 wt %, on the basis of the total weight of the composition.

The polishing slurries commonly used in the CMP for copper processing normally contain a surfactant and corrosion inhibitor (such as BTA or the derivatives thereof). However, these substances may remain on the wafer surfaces after the polishing. These organic residues are difficult to remove by simply using commonly known physical methods, such as static repulsion force, ultrasonic vibration, or scrubbing with a polyvinyl alcohol (PVA) brush. The nitrogen-containing heterocyclic organic base and the alcohol amine compounds contained in the cleaning composition of the invention can increase the saturated solubility of the organic residues (such as BTA) in the cleaning composition, so as to provide a higher driving force to dissolve the BTA particles. Consequently, a better cleaning effect can be achieved by combining a traditional physical removal method with the cleaning composition of the present invention.

The cleaning composition of the invention can be used directly or after dilution with super pure water. In order to reduce the cost of production, transportation and storage, a composition with a higher concentration is generally provided, and then used after dilution with super pure water. The composition is typically diluted at a multiplication in a range of from 10 and 60, depending on the practical use. In the case of special requirements, such as saving processing time, a cleaning composition stock solution with a higher concentration can be used directly for cleaning wafers.

The cleaning composition of the invention can be used at room temperature. The cleaning composition is placed in contact with the copper-containing semiconductor wafers for an effective period of time, and can effectively remove the residual contaminants from the wafer surfaces and simultaneously maintain a better surface roughness of the wafer surfaces. In general, when a lower concentration is used, a longer contact time (e.g. 1-3 min) is needed; and when a higher concentration is used, only a short contact time (e.g. shorter than 1 min) is needed. In practical use, the process optimization regarding the concentration of the cleaning composition and the contact time can be determined by trial and error.

The cleaning composition of the present invention can be used on the cleaning table that is employed for conducting the chemical mechanical planarization. The cleaning composition of the present invention can also be used on a separate cleaning table for cleaning the surface of the wafers that have been subjected to planarization.

The present invention will be further illustrated by the following examples, but is not intended to be limited by the examples. Any modifications and variations that can be easily achieved by those having ordinary skill in the art are contemplated within the scope of the invention.

EXAMPLES

Cleaning compositions containing a nitrogen-containing heterocyclic organic base, an alcohol amine, and a quaternary ammonium hydroxide in different ratios were prepared. The cleaning compositions were diluted with 30 times of super pure water on an Ontrak cleaning table and used to clean polished blank copper wafers. The cleaning time was two minutes and the flux of the cleaning agent was 600 ml/min. After the cleaning was completed, the wafers were measured for the number of the surface defects by the TOPCON WM-1700 particle measuring system and for the surface roughness (Ra) by an atomic force microscope (AFM).

TABLE 1

The number of surface defects and the surface roughness of copper wafers cleaned with cleaning compositions

| | Component | | | | | |
|---|---|---|---|---|---|---|
| No. | Nitrogen-containing Heterocyclic Organic Base | Alcohol Amine | Quaternary Ammonium Hydroxide | Dilution Multiplication | Average Defect Number | Surface Roughness Ra (nm) |
| 1 | piperazine 10% | diethanolamine 25% | tetramethylammonium hydroxide 5% | 30 | 704.0 | 0.748 |
| 2 | piperazine 10% | triethanolamine 25% | tetramethylammonium hydroxide 5% | 30 | 721.5 | 0.480 |
| 3 | piperazine 10% | diethanolamine 25% | tetraethyl ammonium hydroxide 5% | 30 | 620.5 | 0.709 |
| 4 | piperazine 10% | triethanolamine 25% | tetraethyl ammonium hydroxide 5% | 30 | 615.5 | 0.560 |
| 5 | piperazine 10% | monoethanolamine 5% | tetramethylammonium hydroxide 5% | 30 | 635.0 | 0.555 |
| 6 | piperazine 5% | diethanolamine 25% | tetramethylammonium hydroxide 5% | 30 | 603.5 | 0.778 |
| 7 | piperazine 10% | diethanolamine 15% triethanolamine 25% | tetramethylammonium hydroxide 5% | 30 | 452.5 | 0.885 |
| | | Control Examples | | | | |
| 8 | piperazine 0% | diethanolamine 25% | tetramethylammonium hydroxide 5% | 30 | 856.0 | 0.691 |
| 9 | piperazine 0% | triethanolamine 25% | tetramethylammonium hydroxide 5% | 30 | 732.5 | 0.539 |
| 10 | piperazine 10% | diethanolamine 25% | tetramethylammonium hydroxide 0% | 30 | 1556.0 | 0.676 |
| 11 | piperazine 10% | triethanolamine 25% | tetramethylammonium hydroxide 0% | 30 | 2167.5 | 0.469 |
| 12 | | super pure water | | — | 3074.5 | 0.706 |

Comparisons between the compositions of Nos. 1, 8, and 10, and between the compositions of Nos. 2, 9, and 11 reveal that if a composition simultaneously contain a nitrogen-containing heterocyclic organic base, an alcohol amine, and a quaternary ammonium hydroxide, a smallest number of surface defects can be obtained. Moreover, a comparison between the compositions of Nos. 1 to 7 and 12 reveals that the copper wafers cleaned by super pure water have the most surface defects. The compositions of Nos. 1 to 7 not only significantly reduce the number of the surface defects but also maintain the surface roughness of the wafers at a level substantially the same as that of the wafers cleaned by super pure water.

What is claimed is:

1. An aqueous cleaning composition used in the cleaning process during or after a chemical mechanical planarization, consisting essentially of (a) 0.05 to 20 wt % of a nitrogen-containing heterocyclic organic base, wherein the organic base is selected from the group consisting of piperazine, 2-(1-piperazine)ethanol, and a mixture thereof; (b) 0.05 to 50 wt % of an alcohol amine; (c) 0.01 to 10 wt % of a quaternary ammonium hydroxide; and (d) water.

2. The composition according to claim 1, wherein the alcohol amine is selected from the group consisting of ethanolamine, diethanolamine, triethanolamine, propanolamine, methyl ethanolamine, and methyl diethanolamine, and a mixture thereof.

3. The composition according to claim 2, wherein the alcohol amine is selected from the group consisting of ethanolamine, diethanolamine, and triethanolamine, and a mixture thereof.

4. The composition according to claim 1, wherein the quaternary ammonium hydroxide is a tetraalkylammonium hydroxide.

5. The composition according to claim 4, wherein the tetraalkylammonium hydroxide is selected from the group consisting of tetramethylammonium hydroxide, tetraethyl ammonium hydroxide, tetrapropylammonium hydroxide, and tetrabutylammonium hydroxide, and a mixture thereof.

6. The composition according to claim 1, wherein the nitrogen-containing heterocyclic organic base is used in an amount ranging from 0.1 to 15 wt %.

7. The composition according to claim 6, wherein the nitrogen-containing heterocyclic organic base is used in an amount ranging from 0.15 to 10 wt %.

8. The composition according to claim 1, wherein the alcohol amine is used in an amount ranging from 0.1 to 45 wt %.

9. The composition according to claim 8, wherein the alcohol amine is used in an amount ranging from 0.15 to 40 wt %.

10. The composition according to claim 1, wherein the quaternary ammonium hydroxide is used in an amount ranging from 0.02 to 10 wt %.

11. The composition according to claim 10, wherein the quaternary ammonium hydroxide is used in an amount ranging from 0.05 to 8 wt %.

* * * * *